United States Patent
Ueda et al.

(10) Patent No.: US 8,034,418 B2
(45) Date of Patent: Oct. 11, 2011

(54) METHOD FOR FORMING THIN FILM AND APPARATUS THEREFOR

(75) Inventors: Masashi Ueda, Kanagawa (JP); Tomoko Takagi, Kanagawa (JP); Norikazu Ito, Kanagawa (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 1246 days.

(21) Appl. No.: 10/529,904

(22) PCT Filed: Oct. 3, 2003

(86) PCT No.: PCT/JP03/12722
§ 371 (c)(1),
(2), (4) Date: Apr. 1, 2005

(87) PCT Pub. No.: WO2004/031443
PCT Pub. Date: Apr. 15, 2004

(65) Prior Publication Data
US 2006/0011231 A1    Jan. 19, 2006

(30) Foreign Application Priority Data
Oct. 4, 2002   (JP) .................... 2002-292948

(51) Int. Cl.
*C23C 16/00*    (2006.01)
(52) U.S. Cl. ................. 427/569; 118/723 R; 118/723 I
(58) Field of Classification Search ..................... None
See application file for complete search history.

(56) References Cited

U.S. PATENT DOCUMENTS

| | | | | |
|---|---|---|---|---|
| 3,907,660 A * | 9/1975 | Gillery | ................ | 204/298.09 |
| 4,664,951 A * | 5/1987 | Doehler | ................ | 427/248.1 |
| 4,801,474 A * | 1/1989 | Saitoh et al. | ................ | 427/248.1 |
| 5,082,696 A * | 1/1992 | Sharp | ................ | 427/255.14 |
| 5,456,763 A * | 10/1995 | Kaschmitter et al. | ........ | 136/258 |
| 5,993,614 A * | 11/1999 | Nomura | ................ | 204/192.12 |
| 6,719,876 B1 * | 4/2004 | Ueda et al. | ................ | 156/345.48 |
| 2001/0008171 A1 * | 7/2001 | Fukuda et al. | ................ | 156/345 |

(Continued)

FOREIGN PATENT DOCUMENTS

JP          59-014633          1/1984

(Continued)

OTHER PUBLICATIONS

Takagi, T., et. al. Oyo Buturi (or Ohyo Butsuri), Jul. 2002, p. 874-877 (Original in Japanese).*

(Continued)

*Primary Examiner* — Timothy Meeks
*Assistant Examiner* — Joseph Miller, Jr.
(74) *Attorney, Agent, or Firm* — Oblon, Spivak, McClelland, Maier & Neustadt, L.L.P.

(57) ABSTRACT

A plurality of antenna elements, each of which has first and second linear conductors whose first ends are electrically interconnected are formed. The antenna elements are arranged in plane in such a way that the first and second linear conductors are alternated and separated from one another at regular intervals, thereby forming one or more array antennas which are disposed in a chamber. The second ends of the first linear conductors are connected to a high-frequency power supply, and the second ends of the second linear conductors are connected to ground. A plurality of substrates are parallel placed on both sides of the array antennas at distances approximate to the distances between the linear conductors. A film is formed by introducing an ingredient gas into the chamber.

4 Claims, 5 Drawing Sheets

U.S. PATENT DOCUMENTS

| | | | |
|---|---|---|---|
| 2002/0022349 A1* | 2/2002 | Sugiyama et al. | 438/485 |
| 2002/0127764 A1* | 9/2002 | Lohmeyer et al. | 438/89 |
| 2004/0020432 A1* | 2/2004 | Takagi et al. | 118/723 I |
| 2004/0053479 A1 | 3/2004 | Ito | |

FOREIGN PATENT DOCUMENTS

| | | |
|---|---|---|
| JP | 1-205533 | 8/1989 |
| JP | 6-248461 | 9/1994 |
| JP | 2000-345351 | 12/2000 |
| JP | 2001-295052 | 10/2001 |
| JP | 2002-69653 | 3/2002 |
| JP | 2002-217119 | 8/2002 |
| JP | 2002-246619 | 8/2002 |
| WO | 01/19144 | 3/2001 |
| WO | 01/88221 | 11/2001 |
| WO | 02/058121 | 7/2002 |

OTHER PUBLICATIONS

Takagi, T., et. al. Oyo Buturi (or Ohyo Butsuri), Jul. 2002, p. 874-877 (English translation by USPTO).*

* cited by examiner

METHOD FOR FORMING THIN FILM AND APPARATUS THEREFOR

TECHNICAL FIELD

The present invention relates to a thin film formation method of solar cells, preferably applied to mass production, and thin film formation apparatus.

BACKGROUND ART

There are great expectations for solar cells as clean energy sources, whereas further reduction of cost is necessary to attempt extensive diffusion. For this purpose, a thin film formation apparatus capable of uniform deposition of high quality amorphous silicon (hereafter "a-Si") thin film on larger substrates is desired.

Moreover, a tandem structure solar cell, where a-Si solar cell is stacked on microcrystalline silicon (hereafter, "μc-Si") solar cell, gives higher conversion efficiency than a-Si used individually. Therefore, a thin film formation apparatus for the deposition of μc-Si thin film is also desired.

As an art of thin film formation apparatus, Japanese unexamined patent publication No. S59-014633 discloses an art of a capacitively-coupled parallel plate type plasma CVD apparatus.

DISCLOSURE OF INVENTION

In general, parallel plate type plasma CVD apparatus consists of a pair of electrode plates, one connected to a high frequency power source and the other one grounded, facing to each other with a prescribed space apart as a discharge region, and forms thin film on the surface of a substrate placed on the grounded electrode plate. In parallel plate type plasma CVD apparatus, only one substrate or a substrate divided into a number of small pieces can be placed on either one of the pair of electrode plates. This is due to different effect, the electrode plates connected to the high-frequency power source and the grounded one receive from plasma. Therefore, in order to form thin film on a number of substrates simultaneously, the chamber of above-mentioned plasma CVD apparatus must be provided with plural pairs of electrodes in advance. Such a chamber needs a large internal space. Moreover, the maintenance becomes difficult if three or more pairs of electrodes are to be provided. Therefore, in reality, it is appropriate to use an apparatus having a chamber provided with up to two pairs of electrodes, and to treat maximum of two substrates at a time.

Moreover, due to a principal limitation, each electrode plates in parallel plate type plasma CVD apparatus must be larger than the substrate. Thereby, much larger electrode plates are needed in order to deposit on much larger substrates, however, it is difficult to generate uniform plasma between large electrode plates. Because of such a problem, it is extremely difficult to form thin films on large substrates with uniform thickness and characteristics.

The present invention has been achieved in view of above problems. The objective of the present invention is to provide a thin film formation method and an apparatus thereof, by which many plasma sources can be arranged in a limited space, and uniform plasma can be generated within each discharge regions, resulting in uniform deposition of high quality thin film on a large substrate.

According to the first aspect of the present invention, a thin film formation method is composed of plural antenna elements, consisted of two linear conductors where the first ends of the first and the second linear conductors are electrically connected to each other, arranging a number of above antenna elements in a chamber so that the first and the second linear conductors are placed alternately in plane with equal intervals, forming one or more array antenna(s), connecting the second ends of each of the above first linear conductors to high-frequency power source, grounding the second ends of each of the above second linear conductors, installing plural substrates on both sides of and in parallel to respective above array antenna(s) with a space between the array antenna(s) and the substrates comparable to the above intervals between the linear conductors, and depositing thin film on respective above substrates. Preferably, the pressure in the above chamber is kept at 60 Pa or less.

According to the second aspect of the present invention, a thin film formation method is composed of plural antenna elements, consisted of two linear conductors where the first ends of the first and the second linear conductors are electrically connected to each other, arranging a number of above plural antenna elements in a chamber so that the first and the second linear conductors are placed alternately in plane with equal intervals, forming one or more array antenna(s), connecting the second ends of each of the above first linear conductors to high-frequency power source, grounding the second ends of each of the above second linear conductors, and depositing thin film on respective substrates while maintaining the pressure in the above chamber to be at 60 Pa or less.

In the above thin film formation method, preferably the above substrates are reciprocated in the direction parallel to the above array plane and perpendicular to the above first and the second linear conductors.

According to the third aspect of the present invention, a thin film formation apparatus is provided with a chamber equipped with an inlet port to introduce source gas and an exhaust port for evacuation, plural antenna elements consisted of two linear conductors where the first ends of the first and the second linear conductors are electrically connected to each other, the above first and the second linear conductors placed alternately in plane with equal intervals, the second ends of each of the above first linear conductors connected to high-frequency power source, the second ends of each of the above second linear conductors being grounded, one or more array antenna(s) placed in the above chamber, and with plural substrate holders provided so as to place plural substrates on both sides of and in parallel to respective above array antenna(s) with a space between the array antenna(s) and the substrates comparable to the above intervals between the linear conductors.

The above thin film formation apparatus is preferably further provided with dielectric covering the above respective first linear conductor.

According to the fourth aspect of the present invention, a solar cell production method is composed of plural antenna elements, consisted of two linear conductors where the first ends of the first and the second linear conductors are electrically connected to each other, arranging a number of above antenna elements in a chamber so that the first and the second linear conductors are placed alternately in plane with equal intervals, forming one or more array antenna(s), connecting the second ends of each of the above first linear conductors to high-frequency power source, grounding the second ends of each of the above second linear conductors, installing plural substrates on both sides of and in parallel to respective above array antenna(s) with a space between the array antenna(s) and the substrates comparable to the above intervals between the linear conductors, and depositing thin film on respective above substrates. Preferably, the pressure in the above chamber is maintained at 60 Pa or less.

According to the fifth aspect of the present invention, a solar cell production method is composed of plural antenna elements, consisted of two linear conductors where the first ends of the first and the second linear conductors are electrically connected to each other, arranging a number of above antenna elements in a chamber so that the first and the second linear conductors are placed alternately in plane with equal intervals, forming one or more array antenna(s), connecting the second ends of each of the above first linear conductors to high-frequency power source, grounding the second ends of each of the above second linear conductors, and depositing thin film on respective substrates while maintaining the pressure in the above chamber at 60 Pa or less.

In the above solar cell production method, preferably the above substrates are reciprocated in the direction parallel to the above array plane and perpendicular to the above first and the second linear conductors.

According to the sixth aspect of the present invention, a solar cell production apparatus is provided with a chamber equipped with an inlet port to introduce source gas and an exhaust port for evacuation, plural antenna elements consisted of two linear conductors where the first ends of the first and the second linear conductors are electrically connected to each other, the above first and the second linear conductors placed alternately in plane with equal intervals, the second ends of each of the above first linear conductors connected to high-frequency power source, the second ends of each of the above second linear conductors being grounded, one or more array antenna(s) placed in the above chamber, and with plural substrate holders provided so as to place plural substrates on both sides of and in parallel to respective above array antenna(s) with a space between the array antenna(s) and the substrates comparable to the above intervals between the linear conductors.

The above solar cell production apparatus is preferably further provided with dielectric covering the above respective first linear conductor.

According to the seventh aspect of the present invention, solar cell is provided with thin films deposited on the surface of substrates, with plural antenna elements consisted of two linear conductors where the first ends of the first and the second linear conductors are electrically connected to each other, the above first and the second linear conductors placed alternately in plane with equal intervals, forming one or more array antenna(s), the second ends of each of the above first linear conductors connected to high-frequency power source, the second ends of each of the above second linear conductors being grounded, and by maintaining the pressure in the above chamber at 60 Pa or less.

The above thin film is preferably further deposited with above substrates reciprocated in the direction parallel to the above array plane and perpendicular to the above first and the second linear conductors.

BEST MODE FOR CARRYING OUT THE INVENTION

Figure 1:
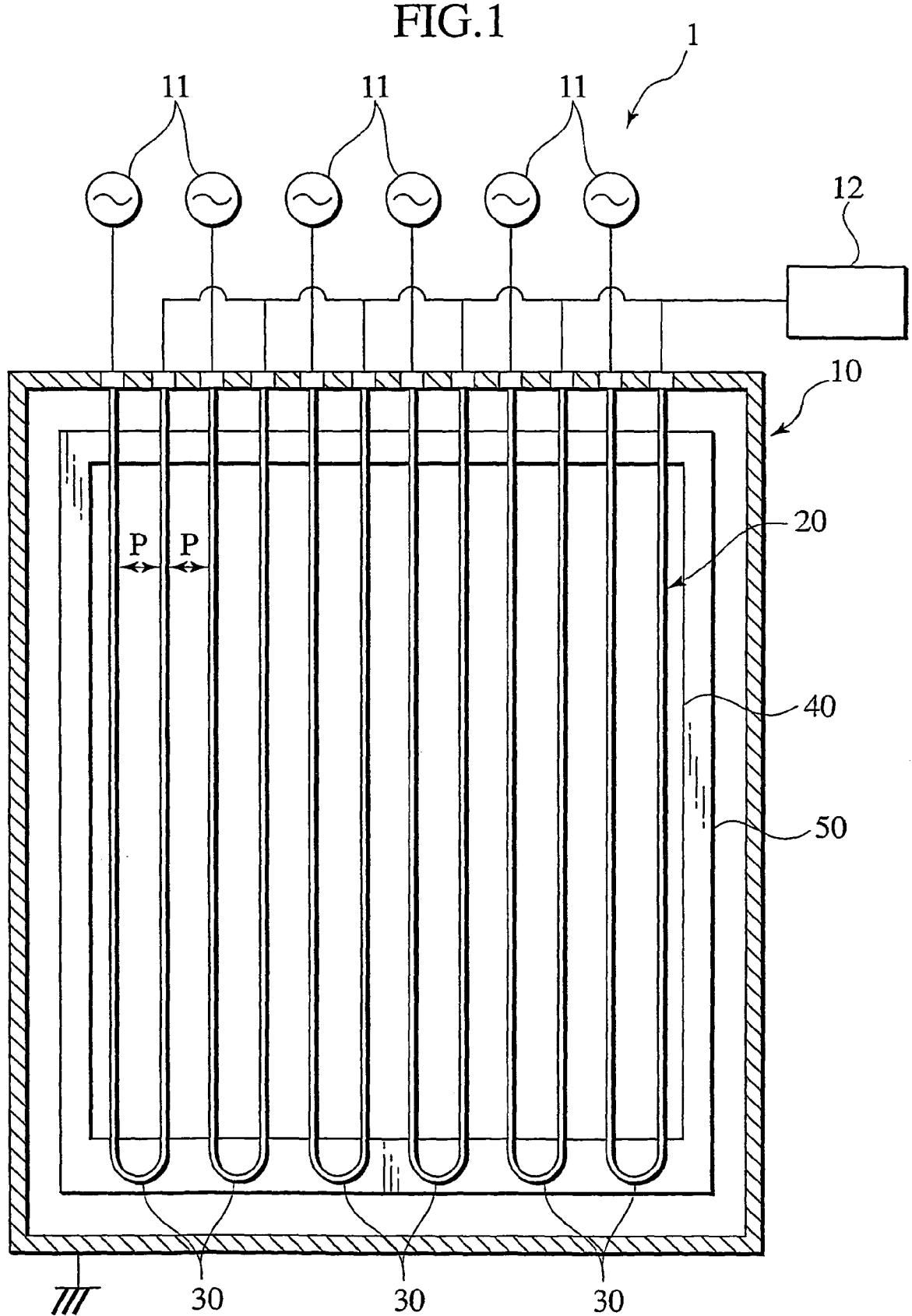
FIG. 1 is a schematic front view of a thin film formation apparatus according to an embodiment of the present invention.

A thin film formation apparatus according to one embodiment of the present invention will be described hereinafter with reference to FIGS. 1 and 2. A thin film formation apparatus 1 is an antenna-type inductively-coupled plasma CVD apparatus, moreover, is relatively large in size to deposit on large (large area) substrates, suitable for the production of solar cells for the use in photovoltaic power generation, and is provided with a film-deposition chamber 10, array antennas 20 installed in the above film-deposition chamber 10 and substrate holders 50 to hold substrate 40 for deposition.

The film-deposition chamber 10 is composed of the a spatial size, with enough height and width to deposit on large substrates 40, for example more than 1 m square in size, and with enough depth to achieve simultaneous deposition on plural (six substrates in the illustrated example) of such substrates.

Plural sets of array antennas 20 (three sets of array antennas, 20a, 20b and 20c in the illustrated example) are placed in the film-deposition chamber 10, and each array antenna 20 consists of plural (six in the illustrated example) antenna elements 30.

Figure 3:
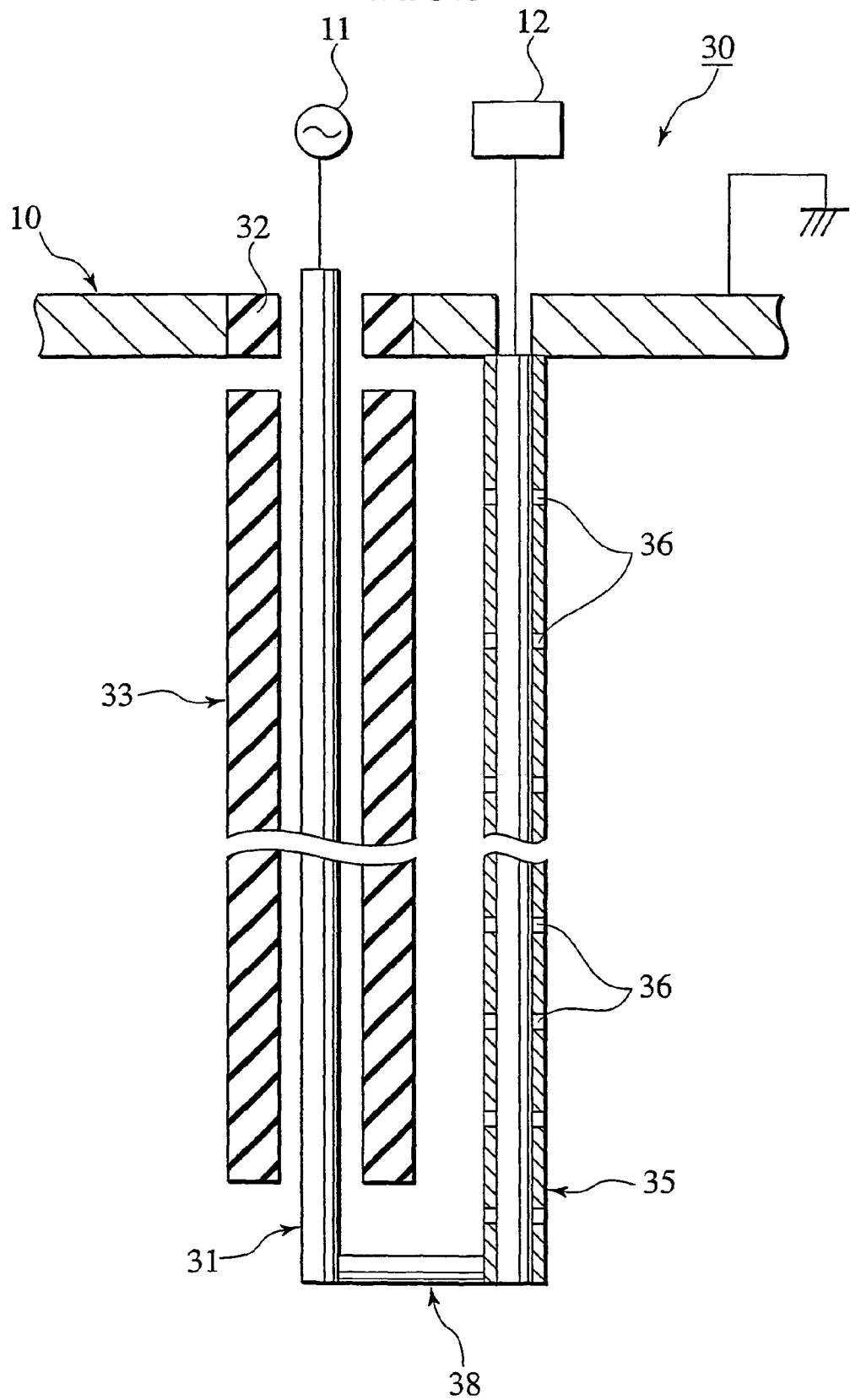
FIG. 3 is a cross sectional view of an antenna element according to the above embodiment.

As shown in FIG. 3, each antenna element 30 consists of two linear conductors, the powered conductor 31 and the grounded conductor 35, placed parallel to each other and electrically connected to adjacent ones at one end (for example at the bottom end) with a conductor 38 to form a parallel line in back and forth in almost U-shape. The other end of above one of the powered conductor 31 (namely, the upper end) is a high-frequency power feeding portion to be connected to a high-frequency power source, and the other end of the grounded conductor 35 (namely, the upper end) is a grounding portion to be grounded.

A solid rod is used as the powered conductor 31 and the high-frequency power feeding portion, for example, pass through a feed-through 32 made of dielectric such as $Al_2O_3$ provided on the wall of film-deposition chamber 10, and is connected to a high-frequency power source 11 placed outside the film-deposition chamber 10. Furthermore, tubular dielectric pipe 33 such as $Al_2O_3$ is provided around the powered conductor 31 inside the film-deposition chamber 10, and the thickness of above dielectric pipe 33 is to be suitably determined.

A tubular pipe with many holes 36 on the surface is used as a grounded conductor 35, which upper end is grounded to the inner surface of the above film-deposition chamber 10 and is connected to a gas supply source 12 placed outside the film-deposition chamber 10. Therefore, the grounded portion of a tubular grounded conductor 35 of respective antenna element 30 functions as the source gas introduction port of the above film-deposition chamber 10.

The above plural antenna elements 30 (six in the illustrated example) are arranged in such a way that each high frequency supply portion and each grounded portion, namely the powered conductors 31 and the grounded conductors 35, respectively, are alternately arranged. All powered conductors 31 and grounded conductors 35 are arranged on the same plane (hereafter, "array plane") with even intervals. Each array antenna 20 is constituted in such a way explained above. Plural array antennas 20 (three sets of array antennas, 20a, 20b and 20c in the illustrated example) are placed parallel to each other in the film-deposition chamber 10 with a prescribed intervals in between. Therefore, respective array plane is placed in the film-deposition chamber parallel to each other with a prescribed interval in between.

The above substrate holder 50 holds a pair of substrates 40 on which thin film is to be deposited at both sides of the array antenna 20, keeping both of the substrates 40 parallel to the above array plane, and moreover, positions the distance D between the array antenna 20 and the substrates 40 (hereafter, "antenna-substrate distance D", see FIG. 2) to be comparable (specified later) to the distance P between the powered conductors 31 and the grounded conductors 35 (see FIG. 1: for example 35 mm). Since three sets of array antennas 20a, 20b and 20c are illustrated as an example, the substrate holder 50 holds one of the substrates 40 each on both sides of respective array antenna 20, resulting in six substrates 40 in total. All substrates 40 are positioned in parallel to the array plane of corresponding array antenna 20, and in such a way that the antenna-substrate distance D is set comparable to the distance P between the powered conductors 31 and the grounded conductors 35 (about 35 mm).

Such substrate holder 50 is constituted so that the substrate holder 50 can be carried in and out of the film-deposition chamber 10 supported by an appropriate carrier (not shown), in order to enable being carried in and out of the film-deposition chamber 10 while holding all of above substrates 40. For this purpose, although not shown in FIG. 1, the side plates on the left and the right sides of the film-deposition chamber 10 are designed to be capable of opening and closing, in such a way while either one of left or right (for example, left) side plate is opened and the substrate holder 50 is carried in the film-deposition chamber 10, the other one (for example, right) side plate is opened and the substrate holder 50 is carried out. Moreover, although not shown, the film-deposition chamber 10 is provided with, for example on the lower part, an exhaust port for evacuation.

Furthermore, the above film-deposition chamber 10 is provided with a heat control system 13 to control the temperature of the above substrate 40 from rising during deposition. The heat control system 13 consists of, for example, an appropriate heat absorbent to absorb heat from the respective substrates 40 via heat radiation or heat conduction, and with a mechanism to release the heat absorbed by the absorbent to the side walls and such of the film-deposition chamber 10 by heat radiation or heat conduction. Besides, the heat control system 13 may be comprised of only a heat absorbent provided with a cooling function using a fluid as a medium, furthermore, without the heat absorbent and only by a waste heat function where the heat inside the film-deposition chamber 10 is forced to be released outside.

In case of using the above thin film formation apparatus 1 constituted in such a way explained above, the deposition process is performed maintaining the pressure in the above film-deposition chamber 10 at 60 Pa or less.

That is to say, first, in the film-deposition chamber 10, all (six) substrates 40 are positioned in parallel to the corresponding array planes of the array antennas 20 (20a, 20b and 20c), with the antenna-substrate distance D set comparable to the distance P (about 35 mm) between the powered conductors 31 and the grounded conductors 35 (D≅P) by the substrate holder 50.

Next, the above source gas is introduced inside all of the grounded conductors 35 of the respective antenna elements 30 of the array antennas 20 (20a, 20b and 20c) from the gas supply source 12 placed outside the film-deposition chamber 10. The source gas is introduced into the film-deposition chamber 10 through the holes 36 on the grounded conductor 35, filling the film-deposition chamber 10, and the pressure inside the film-deposition chamber 10 is controlled to be appropriate at 60 Pa or less.

Then, the deposition process is performed by maintaining the pressure inside the film-deposition chamber 10 to be appropriate at 60 Pa or less, introducing high frequency power (for example, VHF power at 85 MHz) to all the powered conductors 31 of the respective antenna elements 30 of the array antennas 20 (20a, 20b and 20c) from the high-frequency power source 11 placed outside the film-deposition chamber 10, and generating plasma around all powered conductors 31 and grounded conductors 35, connected electrically by conductors 38.

Figure 4A:
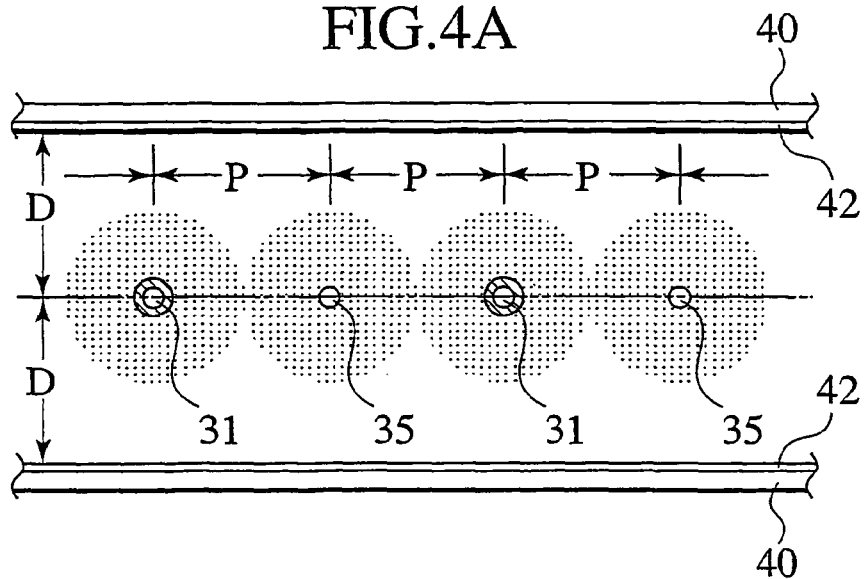
FIG. 4A is a schematic drawing showing a state of forming a thin film in a case where uniform thin film is formed.

As a result of performing the above deposition process, objective thin film is deposited on the surface of all (six) substrates 40 as partially shown in FIG. 4A. The thin film is in the form of amorphous or microcrystalline structure.

When $SiH_4$ gas was practically used as the source gas for the deposition process, microcrystalline silicon (μc-Si) thin films were deposited on all (six) substrates 40 in the film-deposition chamber 10, and the film properties of the thin films were confirmed to be uniform over the whole surface of the substrates 40. Besides, as higher high frequency power above 1 kW per square meter is required for microcrystalline silicon deposition, such a phenomenon happens where the temperature of the respective substrates 40 rises by being exposed to high density plasma during deposition. However, as the film-deposition chamber 10 is provided with the heat control system 13, the film properties were confirmed not being deteriorated by the temperature rise of the substrates 40 during the deposition process, due to the effect of the heat control system 1.

Figure 5A:
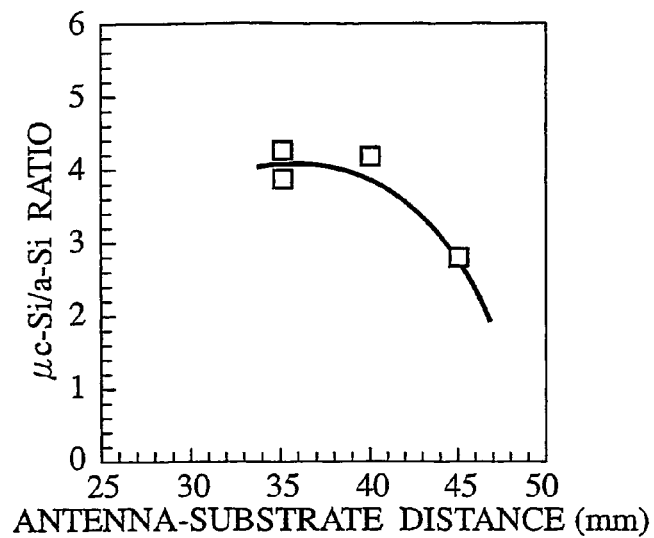
FIG. 5A is a diagram showing the experimental result of the relation between the distance between the antenna elements and the substrate and the properties of the thin film
Figure 5B:
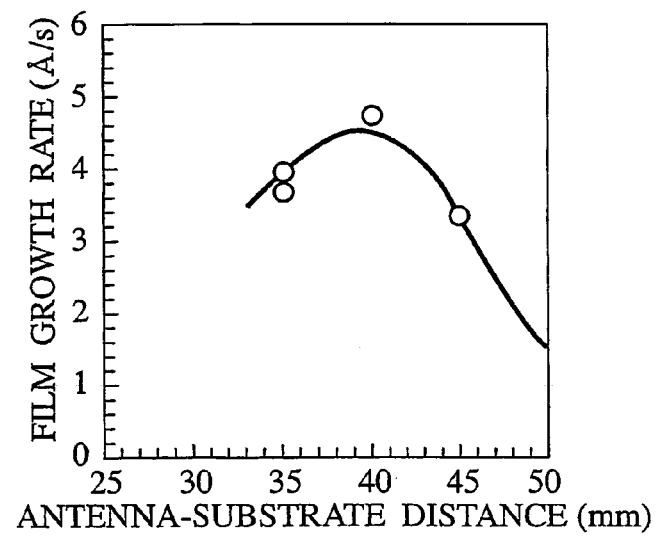
FIG. 5B is a diagram showing the experimental result of the relation between the distance between the antenna elements and the substrate and the growth rate of the thin film

Furthermore, by changing the above antenna-substrate distance D during the deposition process, results shown in FIG. 5A and FIG. 5B were obtained.

As shown in FIG. 5A, when the antenna-substrate distance D is about 35 mm, comparable to the distance P between the powered conductors 31 and the grounded conductors 35, the signal ratio of microcrystalline silicon (μc-Si) to amorphous silicon (a-Si) is the highest, showing good crystallinity and high quality film being obtained. It is shown that even with larger antenna-substrate distance D, up to about 47 mm, considerably high quality films are obtained. Besides, the antenna-substrate distance D shorter than 35 mm is not shown in FIG. 5A, however, it was confirmed that considerably high quality films are obtained down to about 17 mm. From the results obtained above, it was found that the optimum value of antenna-substrate distance D is about 35 mm which is comparable to the distance P between the powered conductors 31 and the grounded conductors 35, and about ±50% of the above optimum value (about 17 mm to about 47 mm) was found to be the permissible range of the antenna-substrate distance D judging from the film quality. This supports that electromagnetic field efficiently induces ionization reaction as long as the antenna-substrate distance D is within the above permissible range.

Figure 4B:
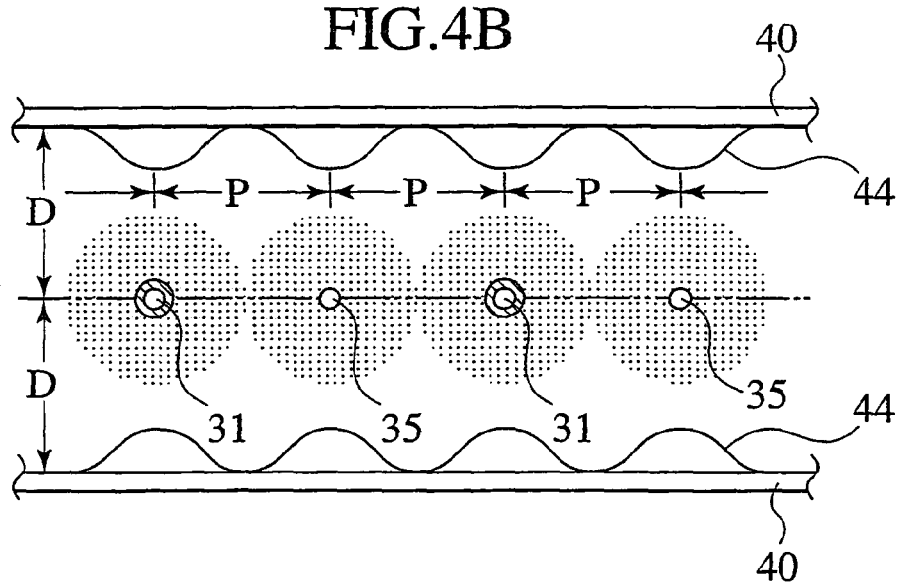
FIG. 4B is a schematic drawing showing a state of forming a thin film in a case where nonuniform thin film is formed.

FIG. 4B shows the experimental results of deposition when the antenna-substrate distance D is close to the lower limit of the permissible range of the optimum value (about 35 mm). The thickness of the deposited film on the substrates 40 is thicker at the positions corresponding to the positions of the powered conductors 31 and the grounded conductors 35, while it becomes thinner as the positions become apart from the powered conductors 31 and the grounded conductors 35, and as a result, a film with a striped pattern with thick and thin parts arranged alternately, with constant intervals corresponding to the powered conductors 31 and the grounded conductors 35, is formed on the respective substrates 40.

Figure 4C:
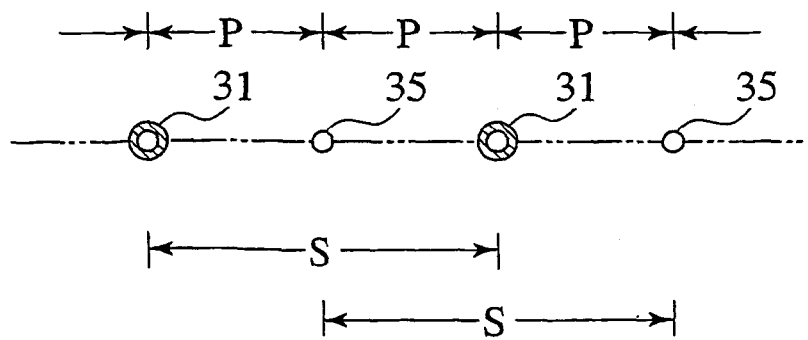
FIG. 4C is a schematic drawing showing a state of forming a thin film and the relation between a stroke S of a substrate and the distance P between the linear conductors.

Accordingly, the formation of above striped pattern can be avoided by repeatedly reciprocating the substrates 40 for an appropriate stroke during deposition in the direction parallel to the array plane and perpendicular to the powered conductors 31 and grounded conductors 35. The length of reciprocating stroke S is, as shown in FIG. 4C, preferably about twice the distance P (about 35 mm) between the powered conductors 31 and the grounded conductors 35 ($S \cong 2P$), that is to say, corresponding to the distance between adjacent array elements 30 of the array antenna 20 (70 mm). This is because, for example, even if the depositing conditions on the substrates 40 differs between the positions corresponding to the powered conductors 31 and the grounded conductors 35 in a strict sense, by reciprocating between two points which are considered to be in the same deposition conditions, such as between one powered conductor 31 and another adjacent powered conductor 31, or between one grounded conductor 35 and another adjacent grounded conductor 35, it is expected to for uniform microcrystalline thin film on the surface of respective substrates 40 without a striped pattern.

Experiment was carried out in such a way where the substrates 40 were reciprocated during deposition for a stroke corresponding to the distance between adjacent array elements 30 of array antenna 20 (70 mm), and it was confirmed that uniform microcrystalline thin film can be formed on the surface of respective substrates 40 without a striped pattern.

Therefore, it was confirmed that high quality microcrystalline film can be formed with uniform thickness distribution without reciprocating the substrates 40 during deposition, if the antenna-substrate distance D is set to a value, within the permissible range and near the optimum value, where the optimum value is comparable to the distance between the powered conductors 31 and the grounded conductors 35 (about 35 mm) and the permissible range is about ±50% of the optimum value. Moreover, even if the antenna-substrate distance D is apart from the optimum value, as long as it is set within the permissible range, it was confirmed to be able to form high quality microcrystalline film uniformly without a striped pattern by repeatedly reciprocating the substrates 40 for appropriate stroke during deposition.

Furthermore, as shown in FIG. 5B, the deposition rate shows a maximum value when the antenna-substrate distance D is about 40 mm, and becomes lower when the antenna-substrate distance D is longer or shorter than this value.

While the above film quality showed the optimum value of the antenna-substrate distance D to be about 35 mm, comparable to the distance between P between the powered conductors 31 and the grounded conductors 35 as shown in FIG. 5A, the deposition rate shows the maximum value when the antenna-substrate distance D is about 40 mm as shown in FIG. 5B, that is longer than the optimum value for film quality which is about 35 mm. One of the reasons for this is suggested to be due to the electromagnetic field, generated around the above powered conductors 31 and the grounded conductors 35 of above array antenna 20, pass through the substrates 40 or leak out when the substrate 40 is too close to the array antenna 20.

Accordingly, in case of shortening the antenna-substrate distance D than the optimum value (about 35 mm) within the permissible range, it is preferred to provide metal backing-plates at the back sides of the substrates 40. This is because VHF power can be made efficiently absorbed into plasma as the metal backing-plates reflect the electromagnetic field.

Figure 5C:
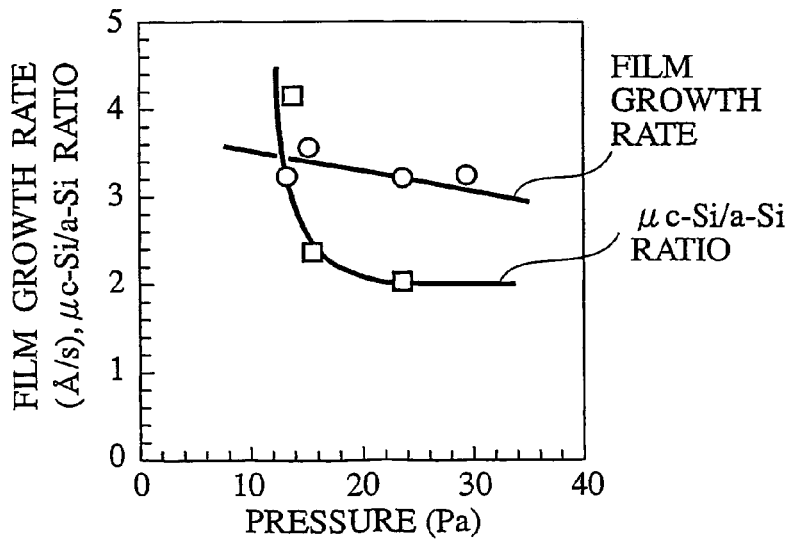
FIG. 5C is a diagram showing the experimental result of the relation between the pressure in the chamber and the properties and the growth rate of the thin film

Furthermore, by varying the pressure in the film-deposition chamber 10 during deposition process, results shown in FIG. 5C were obtained.

As shown in FIG. 5C, when the pressure in the film-deposition chamber 10 becomes about 20 Pa or less, suddenly the signal ratio of μc-Si to a-Si increases, resulting in high cyrstallinity and high quality films. Moreover, the deposition rate also becomes slightly faster when the pressure in the film-deposition chamber 10 is lower. It is not shown in FIG. 5C, however, when the pressure in the film-deposition chamber 10 exceeds 60 Pa, a film with a striped pattern with thick and thin parts arranged alternately is formed on the respective substrates 40, with constant intervals corresponding to the powered conductors 31 and the grounded conductors 35, where it becomes thicker at the positions corresponding to the positions of the powered conductors 31 and the grounded conductors 35, and becomes thinner as the positions become apart from the powered conductors 31 and the grounded conductors 35. And if the source gas pressure in the film-deposition chamber 10 is 60 Pa or less, then it was confirmed that such a striped pattern is practically not formed, high quality film is practically obtained, and useful deposition rate is obtained.

The above-mentioned various matters were confirmed experimentally for μc-Si thin film deposition, however, the same tendency as the confirmed matters obtained in such experiments was found when depositing other thin films (such as a-Si, silicon nitride, diamond like carbon etc.).

Moreover, in the above explanation, as the distance P between the powered conductors 31 and the grounded conductors 35 was about 35 mm, the optimum value for antenna-substrate distance D was about 35 mm, and the permissible range was between about 17 mm and about 47 mm, however, if the distance P between the powered conductors 31 and the grounded conductors 35 is other than this value, as a matter of course, the optimum value of the antenna-substrate distance D depends on the above value, and the permissible range becomes about ±50% of the above antenna-substrate distance D.

As mentioned above, by using the thin film formation apparatus 1 (antenna-type inductively-coupled plasma CVD apparatus) for deposition, simultaneous deposition of thin films on the surface of two substrates 40 per one set of array antenna 20, one substrate per one side of array antenna 20, can be performed. As shown in the figures, when the thin film formation apparatus 1 is provided with three sets of array antennas 20a, 20b and 20c, simultaneous deposition of thin films on the surface of two substrates per each array antenna 20, total of six of substrates 20 can be carried out.

The above respective array antenna 20 is composed of plural antenna elements 30, where the number of antenna elements 30 (six in the example shown in figures) can be increased to any number in principle up to the limitation of the dimension of the film-deposition chamber 10. Therefore, there is no principle limit in size in the width direction in FIG. 1 in order to increase the size of respective substrates 40.

Figure 2:
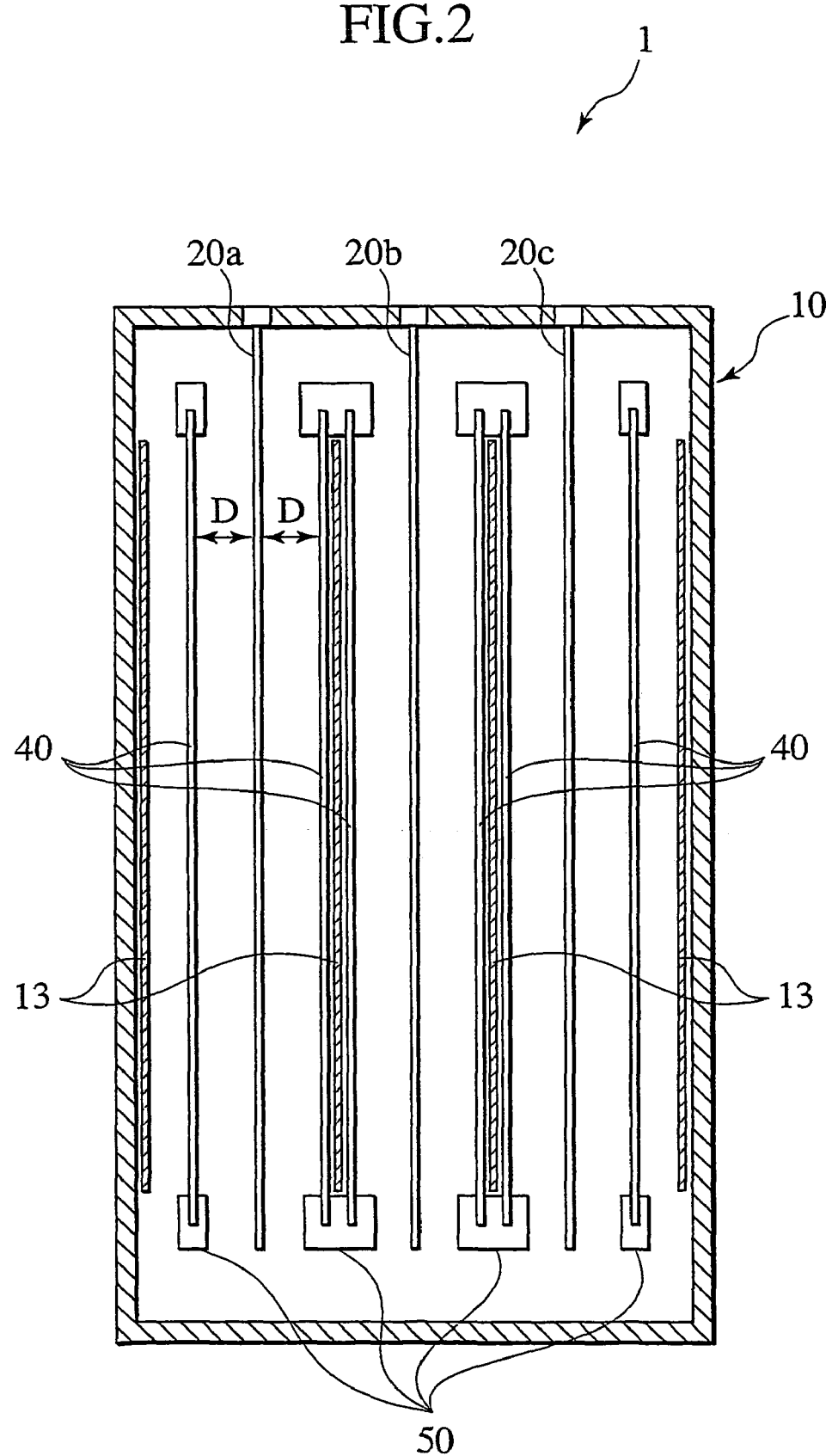
FIG. 2 is a side view of the thin film formation apparatus according to the above embodiment.

On the other hand, the length of the powered conductors 31 and the grounded conductors 35 of respective antenna elements 30 has to be elongated in order to increase the size of respective substrates 40 in the height direction in FIG. 1. The dielectric pipe 33 provided around the powered conductors 31 is effective to elongate the length of the powered conductors 31 and the grounded conductors 35. In case there is no dielectric pipe 33, as high-frequency power is supplied to the powered conductors 31 from the upper end, plasma is only generated for a short distance form the upper part. By using the dielectric pipe 33 when the linear conductors are elongated, the region plasma is generated will be elongated toward the bottom part depending on the length of the conductors.

By controlling the thickness of the dielectric pipe 33 suitably depending on the positions, the plasma density can be maintained uniform. Moreover, as changing the thickness of dielectric pipe 33 is comparable to the control in the antenna-substrate distance D, this method can be used to control the crystallinity and deposition rate of thin films to be obtained.

Furthermore, if the impedance cannot be matched due to the relation between the dielectric constant of the plasma and the shape of the antenna, it is possible to make the impedance matched by, for example, controlling the dielectric constant of the feed-through by changing the thickness of its dielectric, or by adding an appropriate impedance element to the ends of above powered conductors 31 and grounded conductors 35 of respective antenna elements 30 or to the conductors 38.

As mentioned above, the thin film formation apparatus 1 can be utilized as a thin film formation apparatus which is capable to deposit high quality a-Si thin film with uniform thickness distribution on large substrates. Above a-Si thin film is suitable for the use in solar cells, therefore, the above thin film formation apparatus 1 is suitable to be utilized as solar cell production apparatus. Moreover, as higher conversion efficiency can be obtained by the use of tandem structure solar cells, where a-Si solar cell is stacked on µc-S solar cell, than in case of a-Si used individually, the above thin film formation apparatus 1 can be utilized as the thin film formation apparatus for the formation of tandem structure solar cells.

Furthermore, in the embodiment mentioned above, the number of the film-deposition chamber 10 was explained and illustrated as being one, however, the number is not limited to this. For example, it is possible to arrange a number of deposition chambers 10 in line, for p-type, i-type and n-type depositions separately, repeat the carrying in and out of the substrate carrier (not shown) to the respective deposition chambers 10, and to carry out an efficient production of, for example, solar cells for the use in photovoltaic power generation.

While this invention has been described with reference to specific embodiments, this invention is not limited to the above embodiments. It should be apparent that numerous modifications and variations can be made thereto by those skilled in the art without departing from the basic concept and scope of the invention.

INDUSTRIAL APPLICATION

According to the above invention, plural plasma sources can be arranged in a limited space with substrates facing to them, and uniform plasma can be generated between respective plasma sources and the substrates, simultaneous deposition on a number of substrates with uniform properties and thickness distribution can be performed, enabling efficient production of thin films.

The invention claimed is:

1. A thin film formation method, comprising:
    forming a plurality of antenna elements, each of the antenna elements including a first linear conductor having a first end and a second end and a second linear conductor having a first end and a second end, the first end of the first linear conductor and the first end of the second linear conductor of each of said antenna elements being electrically connected to each other;
    arranging a number of said antenna elements in a chamber so that the first and the second linear conductors are placed alternately in a plane in equal intervals, forming one or more array antennas;
    connecting the second ends of each of the first linear conductors to a high-frequency power source;
    grounding the second ends of each of the second linear conductors;
    installing a plurality of substrates on both sides of and in parallel to said array antennas so as to have respective distances between the array antennas and the substrates substantially equal to the intervals; and
    forming thin films on said substrates by generating plasma around the antenna elements,
    wherein the thin films, as deposited, have at least a microcrystalline structure, and
    wherein the method is carried out at a pressure of approximately 60 Pa or less and the distances between the array antennas and the substrates is approximately 35 mm.

2. The thin film formation method as set forth in claim 1, further comprising:
    putting said substrates in a reciprocal motion in a direction parallel to the array plane and perpendicular to the first and the second linear conductors.

3. A solar cell production method, comprising:
    forming a plurality of antenna elements, each of the antenna elements including a first linear conductor having a first end and a second end and a second linear conductor having a first end and a second end, the first end of the first linear conductor and the first end of the second linear conductor of each of said antenna elements being electrically connected to each other;
    arranging a number of said antenna elements in a chamber so that the first and the second linear conductors are placed alternately in a plane in equal intervals to form one or more array antennas;
    connecting the second ends of each of the first linear conductors to a high-frequency power source;
    grounding the second ends of each of the second linear conductors;
    installing a plurality of substrates on both sides of and in parallel to said array antennas so as to have respective distances between the array antennas and the substrates substantially equal to the intervals; and
    forming thin films on said substrates by generating plasma around the antenna elements,
    wherein the thin films, as deposited, have at least a microcrystalline structure, and
    wherein the method is carried out at a pressure of approximately 60 Pa or less and the distances between the array antennas and the substrates is approximately 35 mm.

4. The solar cell production method as set forth in claim 3, further comprising:
    putting said substrates in a reciprocal motion in a direction parallel to the array plane and perpendicular to the first and the second linear conductors.

* * * * *